(12) United States Patent
Cho et al.

(10) Patent No.: US 11,726,330 B2
(45) Date of Patent: Aug. 15, 2023

(54) DISPLAY DEVICE AND AUGMENTED REALITY APPARATUS INCLUDING THE SAME

(71) Applicant: Electronics and Telecommunications Research Institute, Daejeon (KR)

(72) Inventors: Seong-Mok Cho, Daejeon (KR); Yong Hae Kim, Daejeon (KR); Hyunkoo Lee, Daejeon (KR); Sang Hoon Cheon, Daejeon (KR); Kyunghee Choi, Daejeon (KR); Chi-Sun Hwang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 402 days.

(21) Appl. No.: 17/154,737

(22) Filed: Jan. 21, 2021

(65) Prior Publication Data
US 2021/0231956 A1    Jul. 29, 2021

(30) Foreign Application Priority Data

Jan. 23, 2020  (KR) .................. 10-2020-0009219

(51) Int. Cl.
*G02B 27/00*  (2006.01)
*G02B 27/01*  (2006.01)
(Continued)

(52) U.S. Cl.
CPC ........... *G02B 27/0172* (2013.01); *G02C 1/06* (2013.01); *H10K 50/858* (2023.02); *H10K 59/90* (2023.02); *G02B 2027/0178* (2013.01)

(58) Field of Classification Search
CPC ........ G02B 27/0172; G02B 2027/0178; H10K 50/858; H10K 59/90; G02C 1/06
See application file for complete search history.

(56) References Cited

U.S. PATENT DOCUMENTS 6,473,141 B2  10/2002  Moseley et al.
9,036,014 B2   5/2015  Lee et al.
(Continued)

FOREIGN PATENT DOCUMENTS

KR   10-1894556   10/2018
KR   10-1994403    6/2019
WO   2019173113    9/2019

OTHER PUBLICATIONS

Kaan Aksit et al., "Slim near-eye display using pinhole aperture arrays", Applied Optics, Apr. 10, 2015, pp. 3422-3427, vol. 54, No. 11.

*Primary Examiner* — Anne M Hines
(74) *Attorney, Agent, or Firm* — Kile Park Reed & Houtteman PLLC

(57) ABSTRACT

Provided are a display device and an augmented reality apparatus including the same. The display device includes a display panel including display blocks and an optics array including pin hole structures that one-to-one correspond to the display blocks. Here, each of the pin hole structures includes a pin hole and a shielding area surrounding the pin hole, and the display blocks are spaced apart from each other in a first direction parallel to a top surface of the display panel and a second direction crossing the first direction and parallel to the top surface of the display panel.

20 Claims, 4 Drawing Sheets

(51) Int. Cl.
  *G02C 1/06* (2006.01)
  *H10K 50/858* (2023.01)
  *H10K 59/90* (2023.01)

(56) References Cited

U.S. PATENT DOCUMENTS

| | | |
|---|---|---|
| 10,209,519 B2 | 2/2019 | Vieira et al. |
| 10,571,694 B2 | 2/2020 | Ha |
| 2018/0131926 A1 | 5/2018 | Shanks et al. |
| 2018/0356638 A1 | 12/2018 | Yang et al. |
| 2019/0025645 A1* | 1/2019 | Aieta ............... G02F 1/133602 |
| 2019/0318526 A1* | 10/2019 | Hunt ................ G06T 19/006 |

* cited by examiner

DISPLAY DEVICE AND AUGMENTED REALITY APPARATUS INCLUDING THE SAME

CROSS-REFERENCE TO RELATED APPLICATIONS

This U.S. non-provisional patent application claims priority under 35 U.S.C. § 119 of Korean Patent Application No. 10-2020-0009219, filed on Jan. 23, 2020, the entire contents of which are hereby incorporated by reference.

BACKGROUND

The present disclosure herein relates to a display device and an augmented reality apparatus including the same, and more particularly, to a display device including display blocks and an augmented reality apparatus including the same.

Augmented reality represents a technology of overlaying a virtual object to a real world that is seen to a user. In recent years, various contents based on the augmented reality are provided over various fields such as education, game, sports, or tourism. In order to realize the augmented reality, a position or an object of the real world to be overlaid by the virtual object may be specified.

Also, a display device having a see-through structure capable of simultaneously seeing the real world and the virtual object and an augmented reality apparatus including the same have been actively researched.

SUMMARY

The present disclosure provides a display device having a simple structure and a high efficiency.

The present disclosure also provides an augmented reality apparatus having a see-through structure.

The object of the present invention is not limited to the aforesaid, but other objects not described herein will be clearly understood by those skilled in the art from descriptions below.

An embodiment of the inventive concept provides a display device including: a display panel including display blocks; and an optics array including pin hole structures that one-to-one correspond to the display blocks. Here, each of the pin hole structures includes a pin hole and a shielding area configured to surround the pin hole, and the display blocks are spaced apart from each other in a first direction parallel to a top surface of the display panel and a second direction crossing the first direction and parallel to the top surface of the display panel.

In an embodiment, the display panel and the optics array may be spaced apart from each other in a third direction perpendicular to the first direction and the second direction.

In an embodiment, the display device may further include a spacer disposed between the display panel and the optics array.

In an embodiment, a thickness of the spacer in the third direction may be about 0.1 mm to about 10 mm.

In an embodiment, each of the pin hole structures may overlap at least a portion of one of the display blocks in the third direction.

In an embodiment, a width of the shielding area may be proportional to a spaced distance between the display panel and the optics array in the third direction.

In an embodiment, a resolution of each of the display blocks may be inversely proportional to a spaced distance between the display panel and the optics array in the third direction.

In an embodiment, each of the display blocks may include an organic light emitting diode (OLED).

In an embodiment, the display blocks may be arranged in a row in the first direction and arranged in a zigzag shape in the second direction.

In an embodiment, the display blocks may be arranged in a row in the first direction and the second direction.

In an embodiment of the inventive concept, an augmented reality apparatus includes: lenses disposed at positions corresponding to eyes of a user; lens rims configured to surround the lenses, respectively; temples each connected to an end of each of the lens rims. Here, each of the lenses includes: a display panel including display blocks; and an optics array including pin hole structures that one-to-one correspond to the display blocks. Also, each of the pin hole structures includes a pin hole and a shielding area configured to surround the pin hole, and the display blocks are spaced apart from each other in a first direction parallel to a top surface of the display panel and a second direction crossing the first direction and parallel to the top surface of the display panel In an embodiment, each of the display blocks may include a transparent material.

In an embodiment, the display panel and the optics array may be spaced apart from each other in a third direction perpendicular to the first direction and the second direction, and the augmented reality apparatus may further include a spacer disposed between the display panel and the optics array.

In an embodiment, the spacer may include a transparent material.

In an embodiment, a thickness of the spacer in the third direction may be about 0.1 mm to about 10 mm.

In an embodiment, a width of the shielding area may be proportional to a spaced distance between the display panel and the optics array in the third direction.

In an embodiment, a resolution of each of the display blocks may be inversely proportional to a spaced distance between the display panel and the optics array in the third direction.

In an embodiment, the display blocks may be arranged in a row in the first direction and arranged in a zigzag shape in the second direction.

In an embodiment, the display blocks may be arranged in a row in the first direction and the second direction.

In an embodiment, the shielding area may prevent images emitted from the display blocks from being transmitted to the eyes of the user without passing through the pin hole.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
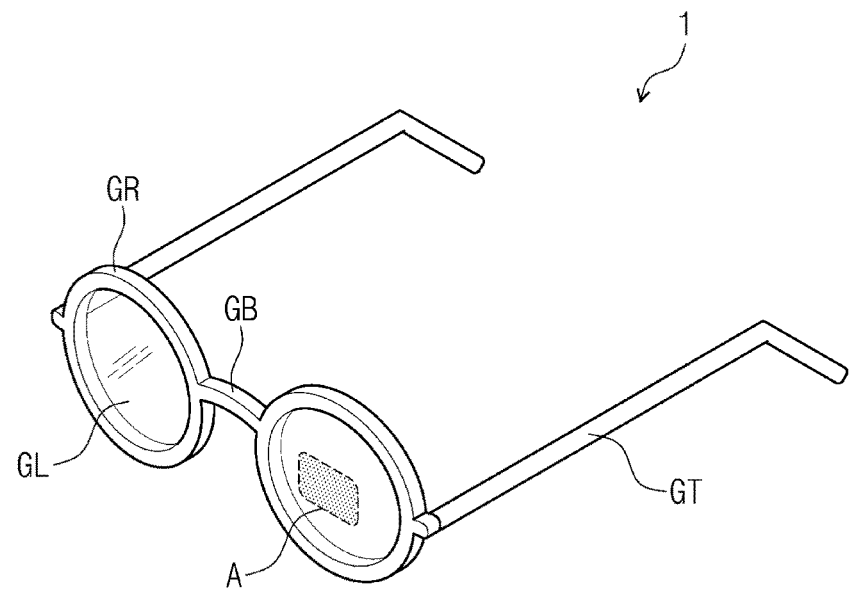
FIG. 1 is a perspective view for explaining an augmented reality apparatus according to an embodiment of the inventive concept.

Exemplary embodiments of the present invention will be described with reference to the accompanying drawings so as to sufficiently understand constitutions and effects of the present invention.

The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. In the figures, the dimensions of components may be exaggerated for clarity of illustration, and the ratio of each of the components may be exaggerated or reduced.

In the following description, the technical terms are used only for explaining a specific exemplary embodiment while not limiting the present disclosure. Unless terms used in embodiments of the present invention are differently defined, the terms may be construed as meanings that are commonly known to a person skilled in the art.

The terms of a singular form may include plural forms unless referred to the contrary. The meaning of 'comprises' and/or 'comprising' specifies a component, a step, an operation and/or an element does not exclude other components, steps, operations and/or elements.

It will also be understood that when a layer is referred to as being "on" another layer or substrate, it can be directly on the other layer or substrate, or intervening layers may also be present.

It will be understood that although the terms first and second are used herein to describe various elements, these elements should not be limited by these terms. These terms are used only to discriminate one region or layer from another region or layer. Therefore, a portion referred to as a first portion in one embodiment can be referred to as a second portion in another embodiment. An embodiment described and exemplified herein includes a complementary embodiment thereof. Like reference numerals refer to like elements throughout.

Hereinafter, a display device and an augmented reality apparatus including the same according to an embodiment of the inventive concept will be described in detail with reference to FIGS. 1 to 5.

FIG. 1 is a perspective view for explaining an augmented reality apparatus according to an embodiment of the inventive concept.

Referring to FIG. 1, an augmented reality apparatus 1 according to an embodiment of the inventive concept may have the substantially same structure as ordinary glasses including two lenses GL. The two lenses GL may be disposed at positions corresponding to eyes of a user. The two lenses GL may be disposed within several centimeters from the eyes of the user. The augmented reality apparatus 1 according to an embodiment of the inventive concept may further include lens rims GR surrounding the lenses GL, respectively, a bridge BG connecting the lens rims GR, and temples GT connected to ends of the lens frames GR, respectively. However, the embodiment of the inventive concept is not limited to the illustrated shape of the temples GT. For example, the temples GT may have various shapes for fixing the lenses GL to ears or a head of the user. Also, although not shown, the augmented reality apparatus 1 according to an embodiment of the inventive concept may include a driving unit (or a control unit). The driving unit may be disposed at the inside of one of the lens rims GR, the bridge GB, and the temples GT. Alternatively, the driving unit may be disposed at the outside of the augmented reality apparatus 1 according to an embodiment of the inventive concept and connected to the lenses GL through one of the lens rims GR, the bridge GB, and the temples GT. The augmented reality apparatus 1 according to an embodiment of the inventive concept may not include complicated and heavy components such as projection optics, a half mirror, or diffraction optics. Thus, the augmented reality apparatus 1 according to an embodiment of the inventive concept may have a small volume and a light weight to provide an improved fit and prevent degradation in image efficiency caused by a long optical path. Also, as the image efficiency increases, daytime visibility may improve. However, the augmented reality apparatus 1 according to an embodiment of the inventive concept may have various head-mounted display (HMD) structures in addition to the glasses shape.

Figure 2:
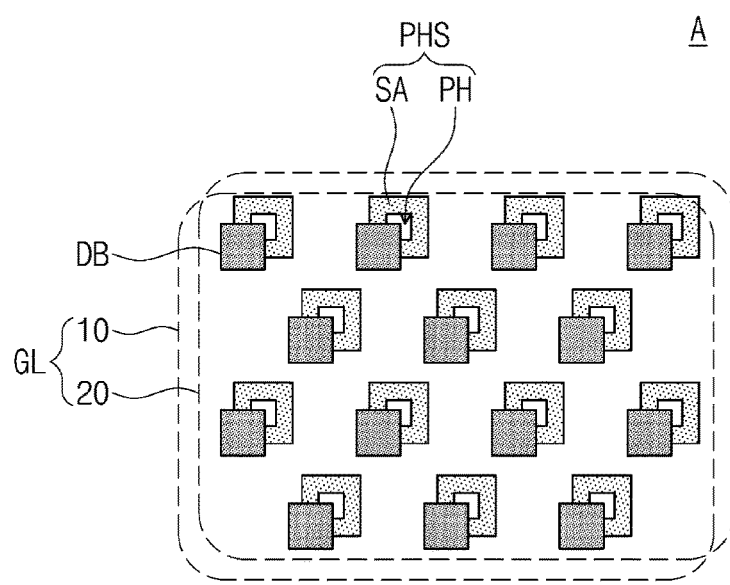
FIGS. 2 and 5 are conceptual views for explaining a display device according to an embodiment of the inventive concept, corresponding to portion A of the augmented reality apparatus of FIG. 1.

FIG. 2 is a conceptual view for explaining a display device according to an embodiment of the inventive concept, corresponding to portion A of the augmented reality apparatus of FIG. 1.

Referring to FIG. 2, the display device according to an embodiment of the inventive concept may include a lens GL including a display panel 10 and optics array 20. Here, the display panel 10 and the optics array 20 may have a flat plate shape extending in a first direction X and a second direction Y. The first direction X and the second direction Y may be parallel to a top surface of the display panel 10 and a top surface of the optics array 20. The second direction Y may cross the first direction X. For example, the first direction X and the second direction Y may be perpendicular to each other. The display panel 10 and the optics array 20 may overlap each other in a third direction Z. Also, the display panel 10 and the optics array 20 may be spaced apart from each other in the third direction Z. For example, the third direction Z may be perpendicular to a plane parallel to the first direction X and the second direction Y.

The display panel 10 may include a plurality of display blocks DB. The display blocks DB may be spaced apart from each other in the first direction X or the second direction Y. For example, the display blocks DB may be arranged in a row in the first direction X and arranged in a zigzag shape in the second direction Y. As the display blocks DB are spaced apart from each other, external light may pass through a space between the display blocks DB. Thus, the display device according to an embodiment of the inventive concept may have a see-through structure capable of simultaneously seeing an image and surroundings and be used for an augmented reality (AR) apparatus in addition to a virtual reality (VR) apparatus. For example, a cross-section perpendicular to the third direction Z of each of the display blocks DB may have a square shape or a rectangular shape. However, the embodiment of the inventive concept is not limited thereto. For example, the cross-section perpendicular to the third direction Z of each of the display blocks DB may have various shapes such as a circular shape, an elliptical shape, and a polygonal shape unlike as illustrated in the drawing. The display blocks DB may, preferably, include a transparent material. For example, the display blocks DB may include a transparent organic light emitting diode (OLED). However, the embodiment of the inventive concept is not limited thereto. For example, the display blocks DB may include an opaque display such as a micro light emitting diode (LED). Although not shown, the display panel 10 may include a transparent material in the space between the display blocks DB. Also, although not shown, the display blocks DB may be electrically connected to at least one driving unit.

The optics array 20 may include a plurality of pin hole structures PHS. Each of the pin hole structures PHS may have a pin hole PH defined in a central portion thereof and a shielding area SA surrounding the pin hole PH. For example, the pin hole PH may have a square shape or a rectangular shape. However, the embodiment of the inventive concept is not limited thereto. For example, the pin hole PH may have various shapes such as a circular shape, an elliptical shape, and a polygonal shape. The pin hole structures PHS may be spaced apart from each other in the first direction X or the second direction Y. For example, the pin hole structures PHS may be arranged in a zigzag shape in the second direction Y. As the pin hole structures PHS are spaced apart from each other, external light may pass through a space between the pin hole structures PHS. Thus, the display device according to an embodiment of the inventive concept may have the see-through structure capable of simultaneously seeing an image and surroundings and be used for the augmented reality (AR) apparatus in addition to the virtual reality (VR) apparatus. Also, each of the pin hole structures PHS may correspond to one of the display blocks DB. More specifically, each of the pin hole structures PHS may overlap at least a portion of one of the display blocks DB. In other words, each of the display blocks DB and the pin hole PH of each of the pin hole structures PHS may have a one-to-one relationship. Thus, images emitted from the display blocks DB may pass through the corresponding pin hole PH. Here, the shielding area SA may prevent the images emitted from the display blocks DB from being transmitted to the eyes of the user through an area outside the pin hole PH. As the images emitted from the display blocks DB are transmitted to the eyes of the user through the pin hole PH, the use always watch an image that is in-focused and has a great depth regardless of a position of the image. For example, although an image surface is disposed with several centimeters from the eyes of the user, the user may always watch the in-focus image.

Figure 3:
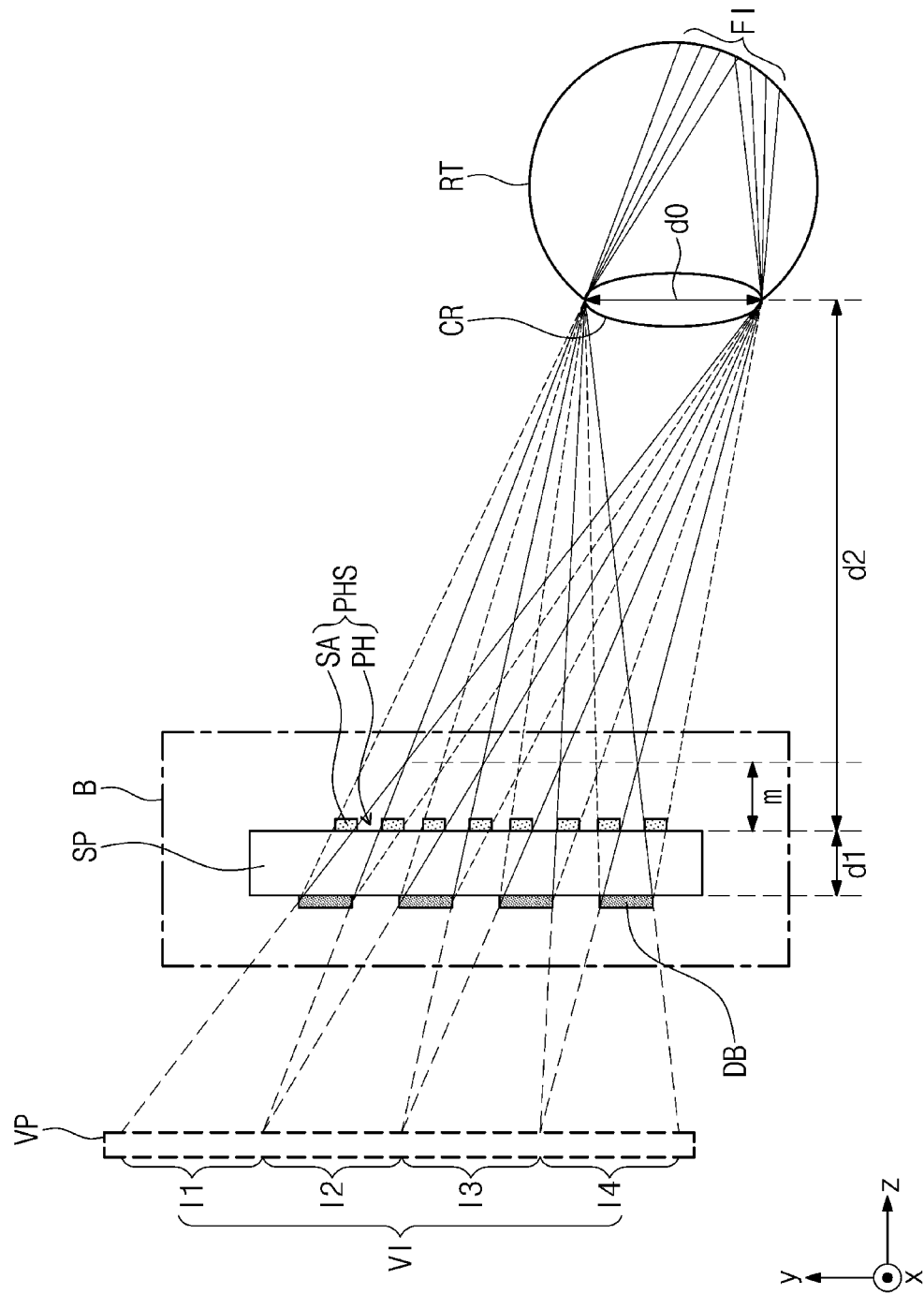
FIG. 3 is a cross-sectional view for explaining the display device according to an embodiment of the inventive concept, corresponding to a cross-section obtained by viewing FIG. 2 in the X-direction.
Figure 4:
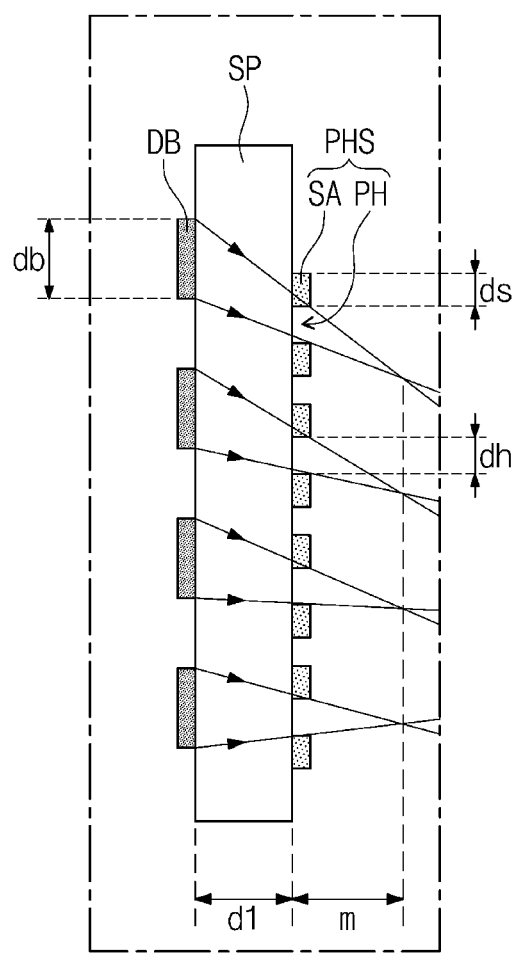
FIG. 4 is an enlarged view illustrating a portion of FIG. 3, corresponding to portion B of FIG. 3.

FIG. 3 is a cross-sectional view for explaining the display device according to an embodiment of the inventive concept, corresponding to a cross-section obtained by viewing FIG. 2 in the X-direction. FIG. 4 is an enlarged view illustrating a portion of FIG. 3, corresponding to portion B of FIG. 3.

A process of transmitting an image to the eyes of the user by the display device according to an embodiment of the inventive concept will be described in detail with reference to FIGS. 3 and 4. Although only four display blocks DB and four pin hole structures PHS are illustrated for convenience of description, this is merely illustrative, and the embodiment of the inventive concept is not limited thereto. For example, more display blocks DB and more pin hole structures PHS may be contained.

The images emitted from the display blocks DB may be transmitted to a cornea CR of the user through the pin hole PH of each of the pin hole structures PHS. Also, the images emitted from the display blocks DB may be refracted at the cornea CR of the user and arrived at a retina RT of the user. The user may recognize that the images emitted from the display blocks DB is emitted from a continuous virtual image surface VP. More specifically, the user may recognize that a virtual image VI including first to fourth images I1 to I4 is emitted from the virtual image surface VP. The first to fourth images I1 to I4 may be images emitted toward the eyes of the user from the display blocks DB, respectively. In terms of the user, each of the display blocks DB may be disposed on a portion shown through the pin hole PH. At least a portion of images FI arrived at the retina RT may overlap each other. When the images FI arrived at the retina RT of the user do not overlap each other, an image emitted from an edge of each of the display blocks DB may be seen darker than an image emitted from a central portion of each of the display blocks DB. Thus, the images FI arrived at the retina RT of the user are necessary to sufficiently overlap each other.

The shielding area SA of each of the pin hole structures PHS may be provided with a minimum length to prevent the images emitted from the display blocks DB from being transmitted to the cornea CR without passing through the pin hole PH. More specifically, a length ds in the second direction Y of the shielding area SA overlapping the pin hole PH in the second direction Y may satisfy [Mathematical equation 1] below. For example, the shielding area SA surround the pin hole PH may have a constant width. Here, the length ds in the second direction Y of the shielding area SA overlapping the pin hole PH in the second direction Y may be defined as a width of the shielding area SA.

$$ds \geq \frac{d0 \times d1}{d1 + d2} \approx \frac{d0 \times d1}{d2} \qquad \text{[Mathematical equation 1]}$$

Here, d0 is a maximum length of the cornea CR of the user in the second direction Y, d1 is a spaced distance between the display blocks DB and the pin hole structures PHS in the third direction Z, and d2 is a spaced distance between the pin hole structures PHS and the cornea CR of the user in the third direction Z. Here, the spaced distance d1 between the display blocks DB and the pin hole structures PHS in the third direction Z may be extremely smaller than the spaced distance d2 between the pin hole structures PHS and the cornea CR of the user in the third direction Z. Thus, the spaced distance d1 may be ignored. Thus, approximation like the [Mathematical equation 1] may be possible. That is, the spaced distance d1 between the display blocks DB and the pin hole structures PHS in the third direction Z may be approximately proportional to the length ds in the second direction Y of the shielding area SA overlapping the pin hole PH in the second direction Y. As the spaced distance d1 between the display blocks DB and the pin hole structures PHS in the third direction Z decreases, the length ds in the second direction Y of the shielding area SA overlapping the pin hole PH in the second direction Y may also decrease. As the length ds in the second direction Y of the shielding area SA overlapping the pin hole PH in the second direction Y decreases, an area shielded by the shielding area SA in an image may also decrease.

Also, a length db in the second direction Y of each of the display blocks DB may satisfy [Mathematical equation 2] below.

$$db \geq \frac{d0 \times (d1 + m)}{d2 - m}, \text{ where } m = \frac{dh \times d2}{dh + d0} \quad \text{[Mathematical equation 2]}$$

Here, m is a distance in the third direction Z from the pin hole structures PHS to a surface obtained by connecting positions at which the first to fourth images I1 to I4 emitted from the display blocks DB are in-focused, and dh is a width of the pin hole PH in the second direction Y.

That is, the length ds of the shielding area SA in the second direction Y and the length db of the display blocks DB in the second direction Y may be designed to satisfy the [Mathematical equation 1] and the [Mathematical equation 2].

The display device according to an embodiment of the inventive concept may further include a spacer SP disposed between the display blocks DB and the pin hole structures PHS. The spacer SP may include a transparent material. A thickness of the spacer SP in the third direction Z may be substantially the same as the spaced distance d1 between the display blocks DB and the pin hole structures PHS in the third direction Z. For example, the spaced distance d1 between the display blocks DB and the pin hole structures PHS in the third direction Z may be about 0.01 mm to about 20 mm. Preferably, the spaced distance d1 between the display blocks DB and the pin hole structures PHS in the third direction Z may be about 0.1 mm to about 10 mm. as the spaced distance d1 between the display blocks DB and the pin hole structures PHS in the third direction Z decreases, a resolution of the display blocks DB may increase. That is, the resolution of the display blocks DB may be inversely proportional to the spaced distance d1 between the display blocks DB and the pin hole structures PHS in the third direction Z.

Figure 5:
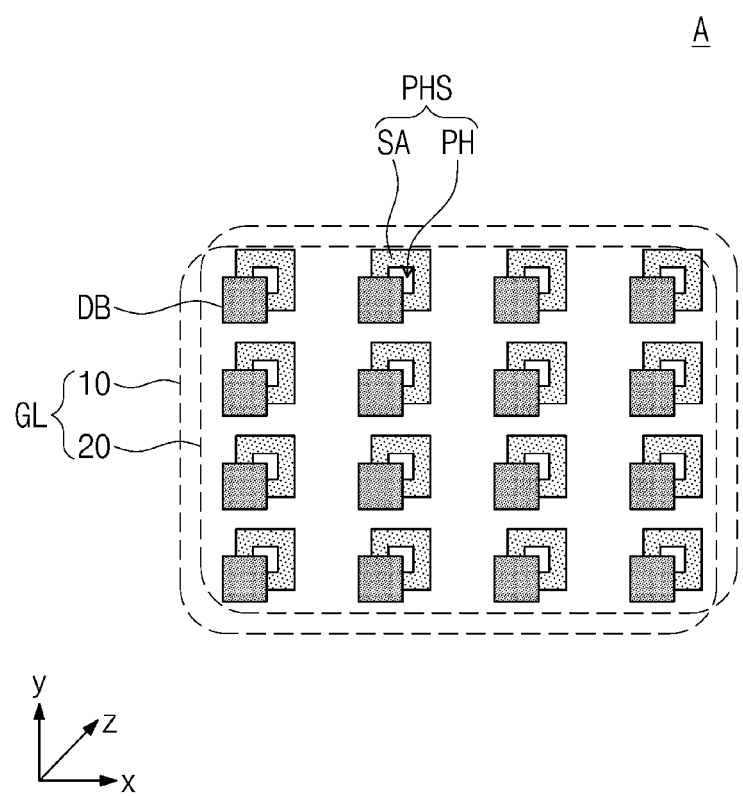

FIG. 5 is a conceptual view for explaining a display device according to an embodiment of the inventive concept, corresponding to portion A of the augmented reality apparatus of FIG. 1. In FIGS. 2 and 5, components designated by the same reference symbols may include substantially the same material and perform substantially the same function. For convenience of description, the substantially same feature as that described with reference to FIG. 2 will be omitted.

Referring to FIG. 5, display blocks DB, which are adjacent to each other, and pin hole structures PHS, which are adjacent to each other, may overlap each other in the first direction X or the second direction Y. Unlike the arrangement method of FIG. 2, the display blocks DB and pin hole structures PHS may be arranged in a row in the first direction X or the second direction Y. However, this is merely illustrative, and the embodiment of the inventive concept is not limited to the arrangement methods in FIGS. 2 and 5. For example, the display blocks DB and pin hole structures PHS may have various arrangement methods such as an one-to-one corresponding relationship between each of the display blocks DB and a pin hole PH of each of the pin hole structures PHS.

The display device according to the embodiment of the inventive concept may transmit the image to the eyes of the user with the high efficiency through the simple structure thereof.

Also the augmented reality apparatus according to the embodiment of the inventive concept may watch the surroundings through the empty space between the display blocks spaced apart from each other to have the see-through structure.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Thus, the above-disclosed embodiments are to be considered illustrative and not restrictive.

What is claimed is:

1. A display device comprising:
a display panel comprising display blocks; and
an optics array comprising pin hole structures that one-to-one correspond to the display blocks,
wherein each of the pin hole structures comprises a pin hole and a shielding area configured to surround the pin hole, and
the display blocks are spaced apart from each other in a first direction parallel to a top surface of the display panel and a second direction crossing the first direction and parallel to the top surface of the display panel.

2. The display device of claim 1, wherein the display panel and the optics array are spaced apart from each other in a third direction perpendicular to the first direction and the second direction.

3. The display device of claim 2, further comprising a spacer disposed between the display panel and the optics array.

4. The display device of claim 3, wherein a thickness of the spacer in the third direction is about 0.1 mm to about 10 mm.

5. The display device of claim 2, wherein each of the pin hole structures overlaps at least a portion of one of the display blocks in the third direction.

6. The display device of claim 2, wherein a width of the shielding area is proportional to a spaced distance between the display panel and the optics array in the third direction.

7. The display device of claim 2, wherein a resolution of each of the display blocks is inversely proportional to a spaced distance between the display panel and the optics array in the third direction.

8. The display device of claim 1, wherein each of the display blocks comprises an organic light emitting diode (OLED).

9. The display device of claim 1, wherein the display blocks are arranged in a row in the first direction and arranged in a zigzag shape in the second direction.

10. The display device of claim 1, wherein the display blocks are arranged in a row in the first direction and the second direction.

11. An augmented reality apparatus comprising:
lenses disposed at positions corresponding to eyes of a user;
lens rims configured to surround the lenses, respectively;
temples each connected to an end of each of the lens rims,
wherein each of the lenses comprises:
a display panel comprising display blocks; and
an optics array comprising pin hole structures that one-to-one correspond to the display blocks,
wherein each of the pin hole structures comprises a pin hole and a shielding area configured to surround the pin hole, and
the display blocks are spaced apart from each other in a first direction parallel to a top surface of the display panel and a second direction crossing the first direction and parallel to the top surface of the display panel.

12. The augmented reality apparatus of claim 11, wherein each of the display blocks comprises a transparent material.

13. The augmented reality apparatus of claim 11, wherein the display panel and the optics array are spaced apart from each other in a third direction perpendicular to the first direction and the second direction, and the augmented reality apparatus further comprises a spacer disposed between the display panel and the optics array.

14. The augmented reality apparatus of claim 13, wherein the spacer comprises a transparent material.

15. The augmented reality apparatus of claim 13, wherein a thickness of the spacer in the third direction is about 0.1 mm to about 10 mm.

16. The augmented reality apparatus of claim 13, wherein a width of the shielding area is proportional to a spaced distance between the display panel and the optics array in the third direction.

17. The augmented reality apparatus of claim 13, wherein a resolution of each of the display blocks is inversely proportional to a spaced distance between the display panel and the optics array in the third direction.

18. The augmented reality apparatus of claim 11, wherein the display blocks are arranged in a row in the first direction and arranged in a zigzag shape in the second direction.

19. The augmented reality apparatus of claim 11, wherein the display blocks are arranged in a row in the first direction and the second direction.

20. The augmented reality apparatus of claim 11, wherein the shielding area prevents images emitted from the display blocks from being transmitted to the eyes of the user without passing through the pin hole.

* * * * *